US006836163B2

(12) United States Patent
Spehar

(10) Patent No.: US 6,836,163 B2
(45) Date of Patent: Dec. 28, 2004

(54) DIFFERENTIAL OUTPUT STRUCTURE WITH REDUCED SKEW FOR A SINGLE INPUT

(75) Inventor: James R. Spehar, Albuquerque, NM (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/678,937

(22) Filed: Oct. 3, 2003

(65) Prior Publication Data

US 2004/0066216 A1 Apr. 8, 2004

Related U.S. Application Data

(63) Continuation of application No. 10/125,963, filed on Apr. 18, 2002, now Pat. No. 6,700,420.

(51) Int. Cl.[7] .............................................. H03L 7/00
(52) U.S. Cl. ....................................... 327/141; 327/161
(58) Field of Search ................................. 327/141, 161, 327/182, 183, 269, 257, 262, 274, 295, 395, 400, 170, 333; 326/83, 84, 86

(56) References Cited

U.S. PATENT DOCUMENTS

| 5,375,148 A | * | 12/1994 | Parker et al. | ............... 375/376 |
| 6,107,847 A | * | 8/2000 | Johnson et al. | ............. 327/143 |
| 6,420,920 B1 | * | 7/2002 | Huber et al. | ................ 327/257 |

* cited by examiner

*Primary Examiner*—Linh My Nguyen

(57) ABSTRACT

The invention provides an improved differential output structure with minimal skew and introduces less process variations. According to one embodiment of the invention, a differential output structure is provided and comprises an input line, an output driver and a sync circuit. The input line includes first and second paths. The first path has an input end for receiving input signals. The first path also has an output end and includes at least one driving element. The second path has an input end operably coupled to the input end of the first path for receiving the input signals. The second path also has an output end. The output driver is operably coupled to the output ends of the first and second paths and is configured to provide differential outputs. The sync circuit is operably coupled between the first and second paths and is configured to synchronize the speed of signals traveling on the two paths.

20 Claims, 9 Drawing Sheets

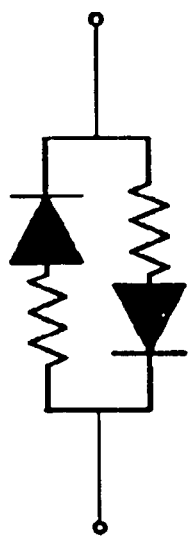 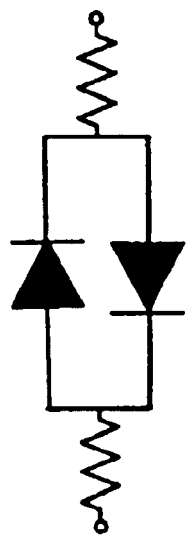 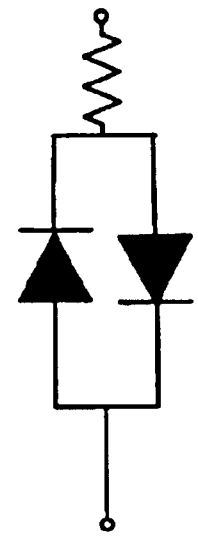
FIG. 3B     FIG. 3C     FIG. 3D
 
FIG. 3E     FIG. 3F

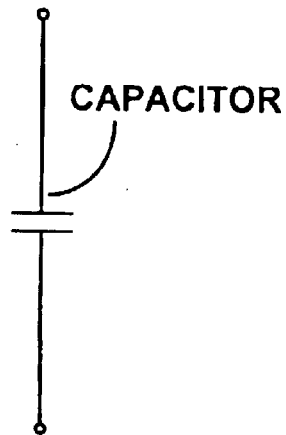
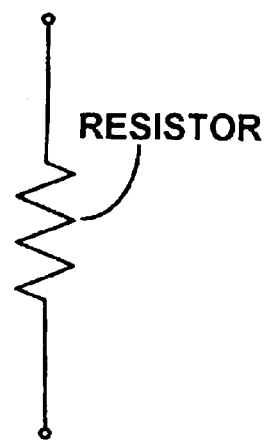
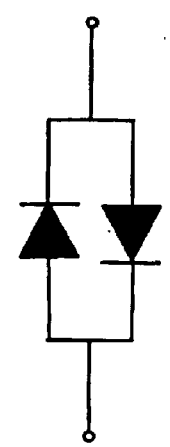
FIG. 3G     FIG. 3H     FIG. 3I
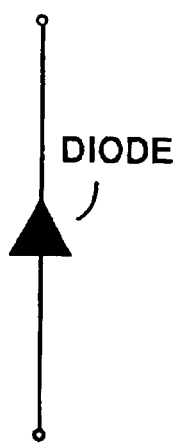
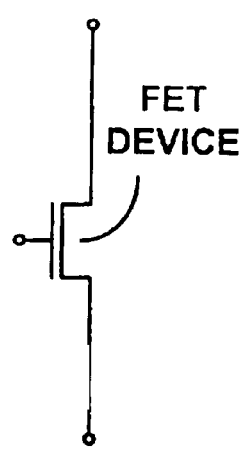
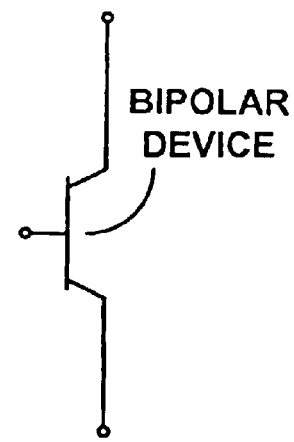
FIG. 3J     FIG. 3K     FIG. 3L

DIFFERENTIAL OUTPUT STRUCTURE WITH REDUCED SKEW FOR A SINGLE INPUT

This is a Continuation of U.S. patent application Ser. No. 10/125,963, filed on Apr. 18, 2002, now U.S. Pat. No. 6,700,420.

BACKGROUND OF THE INVENTION

The invention relates generally to semiconductor integrated circuit (IC) devices and more particularly, it relates to differential output structures with reduced skew for single inputs.

In the semiconductor IC industry, board manufacturers are challenged with integrating products with different input and output standards, e.g., TTL (Transistor Transistor Logic) to LVDS (Low Voltage Differential Swing), LVTTL (Low Voltage Transistor Transistor Logic) to LVDS, etc. Typically, when a single input standard such as LVTTL is converted to a differential output standard such as LVDS, the two differential outputs are skewed apart from one another by at least one gate delay, as will be illustrated with reference to FIG. 1.

FIG. 1 shows a conventional differential output structure 10, in which a single input A is used to generate two differential and complimentary output signals on output M and output N. In FIG. 1, there are three inverters 12, 16 and 18 between input A and point D and two inverters 26 and 28 between input A and point F. The difference of one inverter or one gate delay between path 1 (from input A to point D) and path 2 (from input A to point F) will cause switching noise on output M and output N, which is related to the skew between node D and node F. Switching noise is caused when the same logic level appears on output M and output N. All outputs have some switching noise caused by skew. However, too much skew or switching noise can render a product unusable because it will cause improper logic or clock translation in a receiver which the differential output is driving.

Some solutions have been proposed to limit the skew. One solution is to change the ratios of width/length (W/L) of the inverters in path 1 and path 2 in order to match skews at point D and point F in FIG. 1. Another solution is to make the sums of the channel lengths and widths of the inverters in path 1 equal to the sums of the channel lengths and widths in path 2, respectively, as follows:

$$L_{12}+L_{16}+L_{18}=L_{26}+L_{28}$$

$$W_{12}+W_{16}+W_{18}=W_{26}+W_{28}$$

where $L_{12}$, $L_{16}$, $L_{18}$, $L_{26}$ and $L_{28}$ are the channel lengths of inverters 12, 16, 18, 26 and 28, respectively; and $W_{12}$, $W_{16}$, $W_{18}$, $W_{26}$ and $W_{28}$ are the channel widths of inverters 12, 16, 18, 26 and 28, respectively.

However, these proposed solutions suffer from several drawbacks. When an inverter chain is laid out, a good design practice is to characterize the process and determine the ratio of PMOS (p-type metal oxide semiconductor) and NMOS (n-type metal oxide semiconductor), which gives the desired power consumption, speed, duty cycle, propagation time, etc. For most processes, the ratio of PMOS width (Wp) to NMOS width (Wn) is typically between 2 and 3 to 1. By not using a constant Wp to Wn ratio in the proposed solutions described above, it makes matching every differential inverter path a numerical problem. Moreover, the non-ratioed changing of the length for the PMOS and NMOS devices compounds the problem even further since different lengths and widths add additional processing variations.

Therefore, there is a need for an improved differential output structure with reduced skew, while introducing less process variations.

SUMMARY OF THE INVENTION

The invention provides an improved differential output structure with minimal skew and introduces less process variations.

According to one embodiment of the invention, a differential output structure is provided and comprises an input line, an output driver and a sync circuit. The input line includes first and second paths. The first path has an input end for receiving input signals. The first path also has an output end and includes at least one driving element. The second path has an input end operably coupled to the input end of the first path for receiving the input signals. The second path also has an output end. The output driver is operably coupled to the output ends of the first and second paths and is configured to provide differential outputs. The sync circuit is operably coupled between the first and second paths and is configured to synchronize the speed of signals traveling on the two paths.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein:

FIGS. 3B–3L show other alternative implementations of the sync circuit;

Throughout the drawings, the same reference numerals indicate similar or corresponding features or functions.

DETAILED DESCRIPTION OF THE PREFERRED EMBODIMENTS

Figure 1:
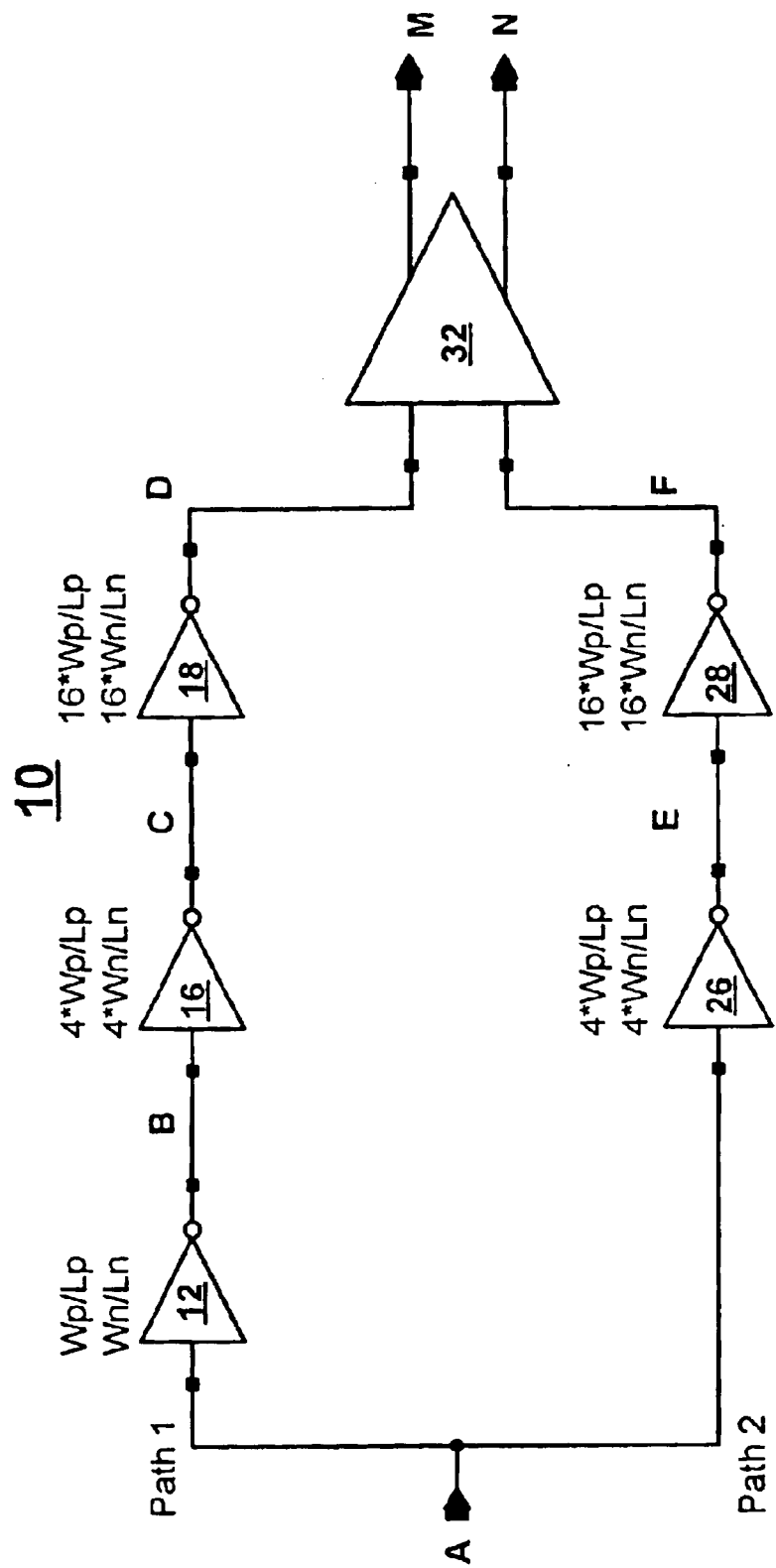
FIG. 1 shows a conventional differential output structure.
Figure 2:
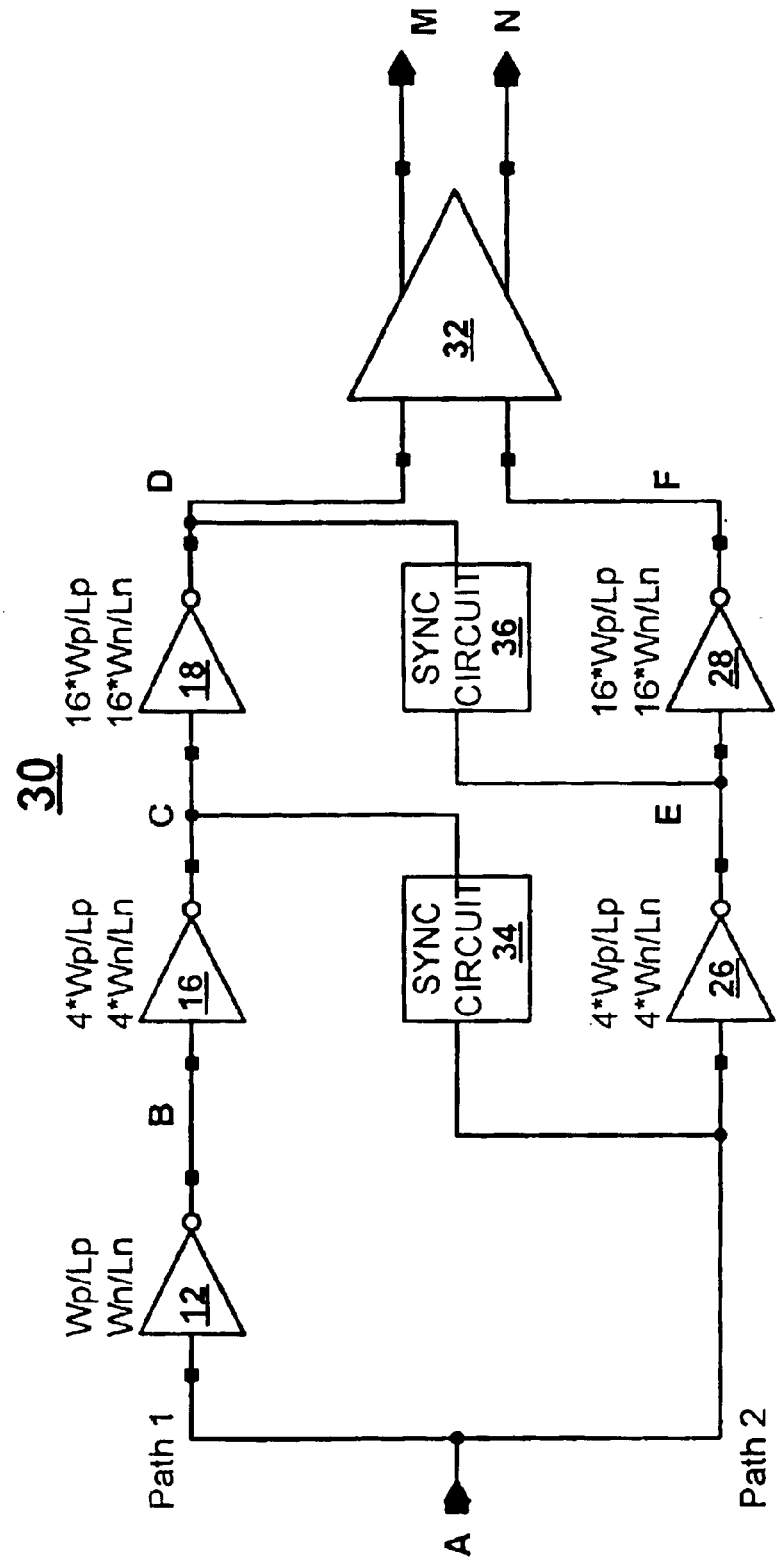
FIG. 2 shows a differential output structure according to a first embodiment of the invention.

FIG. 2 shows a differential output structure 30 according to a first embodiment of the invention. Output structure 30 includes paths 1 and 2. Path 1 is formed by a series connection of driving elements, such as inverters 12, 16 and 18. Path 2 is also formed by a series connection of driving elements, such as inverters 26 and 28. Output structure 30 also includes sync circuits 34 and 36, which dynamically couples the two paths between input A and point C, and between points D and E, respectively. Path 1 and path 2 are dynamically coupled because the energy in path 2 is used to aid in the switching of path 1. This energy transfer occurs when the input to both paths changes logic states (i.e., ground to Vdd or Vdd to ground). The transfer of energy slows down path 2 and speeds up path 1. Output structure 30 further includes an output driver 32, which is coupled between the outputs of the two paths. Driver 32 is a standard differential output driver that may represent any differential output standards (e.g., LVDS, PECL, SSTL, SLVS). In FIG. 2, input A travels along the two paths and is converted to a non-inverted signal M and an inverted signal N.

In FIG. 2, path 1 is slower than path 2 due to an additional inverter. Sync circuits 34 and 36 provide synchronization functions to the two paths so that signals traveling on path 1 and path 2 arrive at the inputs of driver 32 at substantially the same time. Sync circuits 34 and 36 may be implemented, for example, to slow down the two paths by predetermined factors to achieve synchronizations, which is illustrated below in connection with FIG. 3.

Figure 3A:
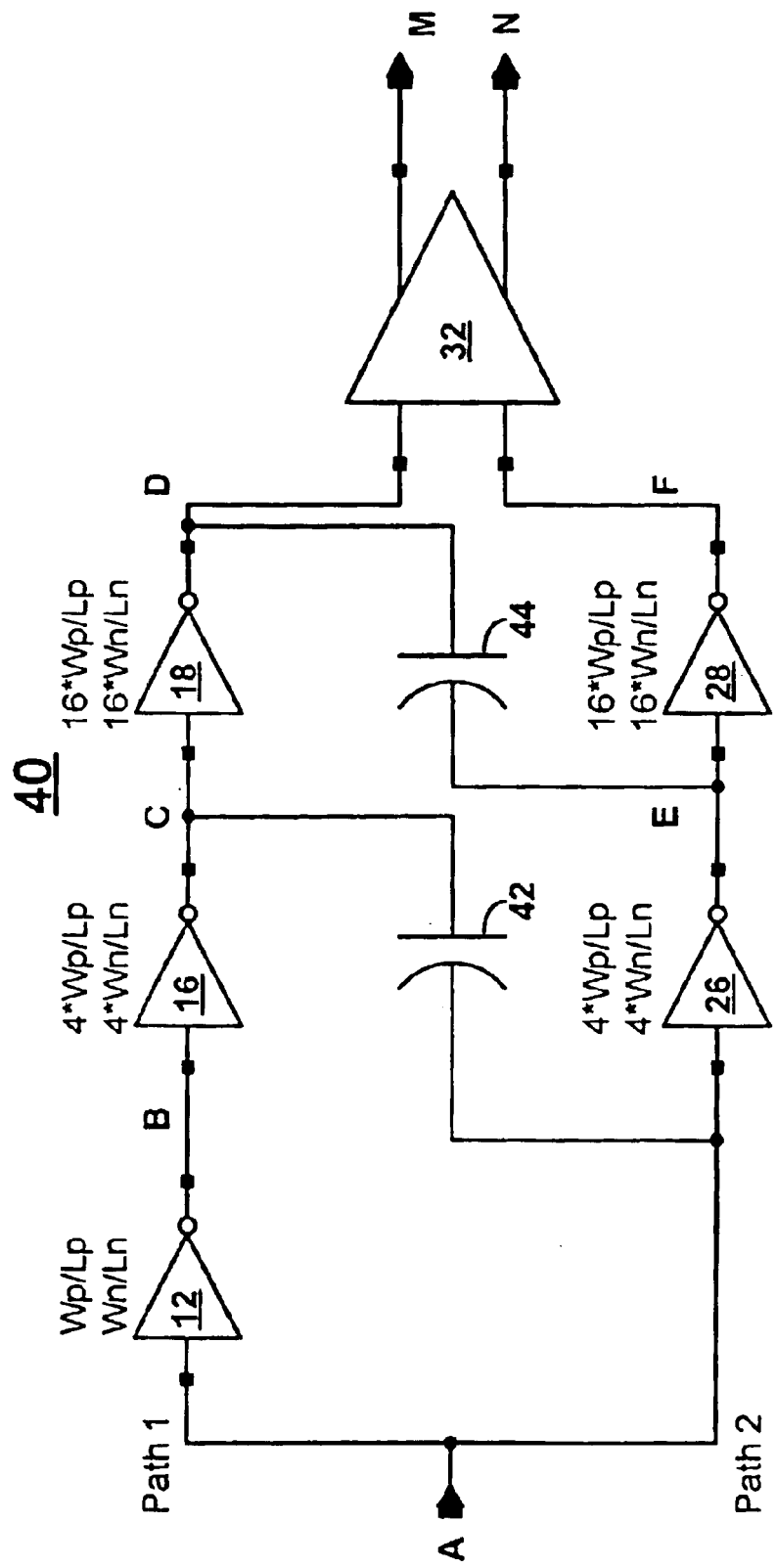
FIG. 3A shows a specific implementation of the differential output structure in FIG. 2.

FIG. 3A shows a differential output structure 40, which is a specific implementation of output structure 30 in FIG. 2. In FIG. 3A, sync circuits are implemented with capacitors 42 and 44, which dynamically couple the two paths. Capacitors 42 and 44 are used to slow down the faster path 2, as will be described below in detail.

In this embodiment, as in FIG. 2, the following parameters are used, i.e., taper ratio=4, and Wp/Wn=3 for each gate, where Wp and Wn are the widths of the PMOS and NMOS transistors respectively. Other taper and PMOS to NMOS ratios are also possible. Assuming Wn=1 and Ln=Lp=1, path 1 would be sized as follows: for inverter 12: Wp/Lp=3/1, Wn/Ln=1/1; for inverter 16: 4*(inverter 12), i.e., Wp/Lp=12/1, Wn/Ln=4/1; and for inverter 18: 16*(inverter 12), i.e., Wp/Lp=48/1, Wn/Ln=16/1. Similarly, path 2 would be sized as follows: for inverter 26: 4*(inverter 12), i.e., Wp/Lp=12/1, Wn/Ln=4/1; and for inverter 28: 16*(inverter 12), i.e., Wp/Lp=48/1, Wn/Ln=16/1.

In FIG. 3A, capacitors 42 and 44 are sized such that capacitor 44 is a chosen factor times larger than capacitor 42. In this example, capacitor 44 is four times larger than capacitor 42. Capacitor 42, which is connected between point C and input A, slows down path 2 by a factor of 4, while slowing down path 1 by a factor of 1 since point C is charged at a speed four times faster than at input A. This is because inverter 16 in path 1 has four times the current drive capability to drive capacitor 42 as compared that from input A on path 2, i.e., there are four times current flowing at point C than at input A. By charging the capacitor 42 faster, it causes signals to move faster. Capacitor 42 also speeds up the logic transition at point C because is dynamically coupled to point A.

Capacitor 44 functions in a similar manner as capacitor 42. The larger value of capacitor 44 is necessary for the larger sizes of inverters 18 and 26, which have larger current driving capabilities.

The capacitors in FIG. 3 align path 1 with path 2. For example, path 1 may be a 100 ps slower than path 2 without the sync circuit. So the number of delays will slow path 2 and speed up path 1 until they are equal. If path 1 becomes faster than path 2, then path 1 will be dynamically coupled to path 2 causing these to paths to stay aligned.

The number of inverters in path 1 and path 2 are usually determined by the size of driver 32. Furthermore, the dynamically coupling of the slower path to the faster path can be done at all points. A good place to put the sync circuit is in the beginning of the inverter chains after the paths have already split. The number of sync circuits needed depends on the amount of skew between path 1 and path 2.

FIGS. 3B–3L show other alternative implementations of the sync circuit, all of which are energy transfer elements or circuits.

Figure 4:
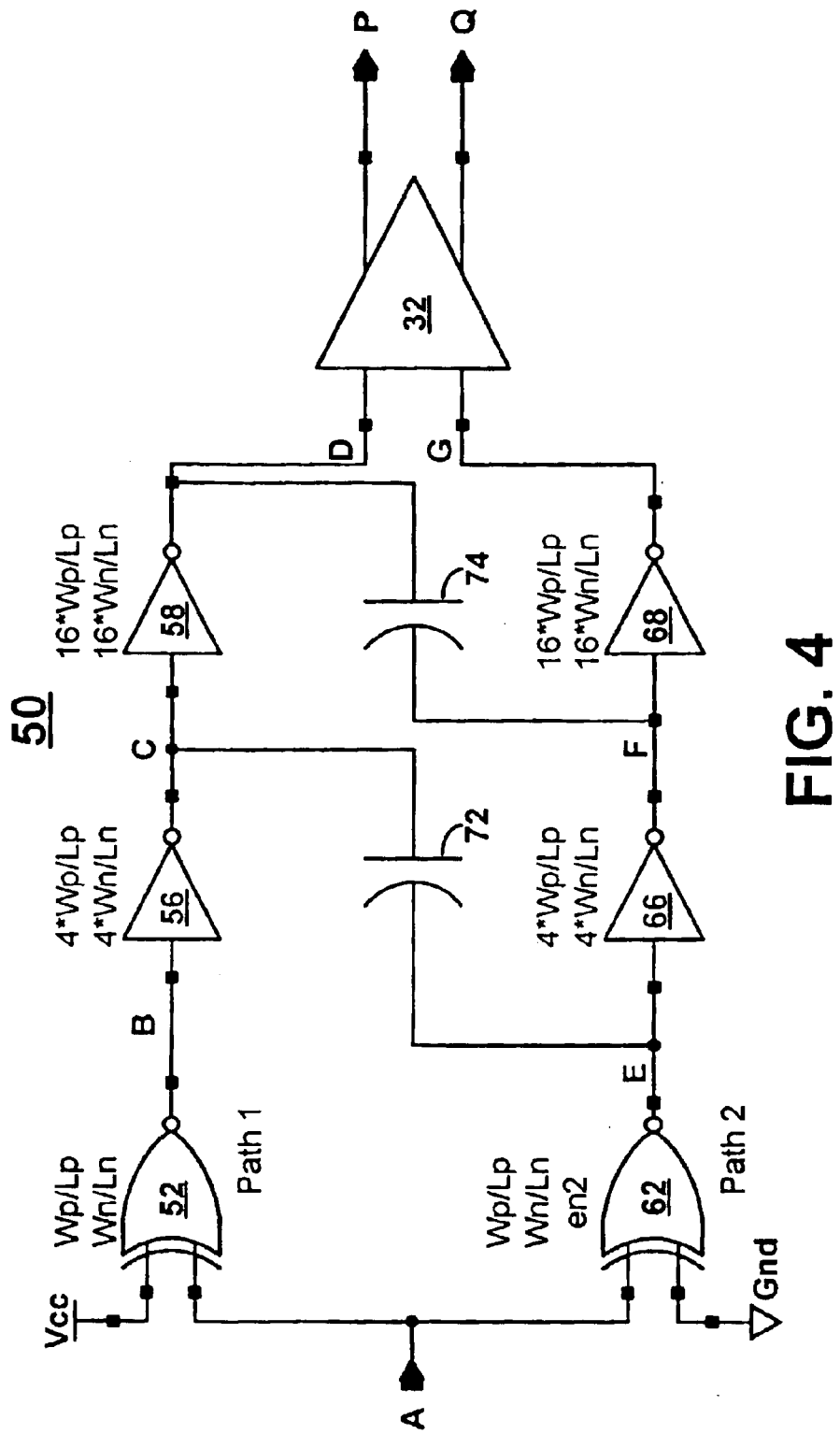
FIG. 4 shows a differential output structure according to a second embodiment of the invention.

FIG. 4 shows a differential output structure 50 according to a second embodiment of the invention. In FIG. 4, differential output structure 50 includes paths 1 and 2. Path 1 is formed by a series connection of driving elements, such as an exclusive OR (XOR) gate 52, an inverter 56 and an inverter 58. Path 2 is also formed by a series connection of driving elements, such as an exclusive NOR (XNOR) gate 62, an inverter 66 and an inverter 68. Path 1 is slower than path 2 due to an additional inversion inherent in the CMOS circuit of gate 52. Output structure 50 also includes sync circuits, such as capacitors 72 and 74, which dynamically couple the two paths. Additionally, output structure 50 includes an output driver 32, which is coupled to the outputs of the two paths.

In this embodiment, similar parameters as in FIG. 3A are used, i.e., taper ratio=4, and Wp/Wn=3 for each gate, where Wp and Wn are the widths of the PMOS and NMOS transistors respectively. Again other taper and PMOS to NMOS ratios are possible. Assuming Wn=1 and Ln=Lp=1, path 1 would be sized as follows: for gate 52: Wp/Lp=3/1, Wn/Ln=1/1; for inverter 56: 4*(gate 52), i.e., Wp/Lp=12/1, Wn/Ln=4/1; and for inverter 58: 16*(gate 52), i.e., Wp/Lp=48/1, Wn/Ln=16/1. Similarly, path 2 would be sized as follows: for gate 62: Wp/Lp=3/1, Wn/Ln=1/1; for inverter 66: 4*(gate 62), i.e., Wp/Lp=12/1, Wn/Ln=4/1; and for inverter 68: 16*(gate 62), i.e., Wp/Lp=48/1, Wn/Ln=16/1.

In FIG. 4, an input A drives both gates 52 and 62 via one of their inputs. Gate 52 has its other input coupled to a power supply Vcc, so that it functions as an inverter. On the other hand, gate 62 has its other input coupled to a ground Gnd, so that it functions as a buffer. Input signals travel along the two paths and are output as a non-inverted signal P of the input A and as an inverted signal Q of input A.

In this embodiment, as in FIG. 3A, capacitors 72 and 74 are also used to slow down the faster path 2. Capacitors 72 and 74 are sized such that capacitor 74 is four times larger than capacitor 72. Capacitor 72, which is connected between point C and point E, slows down path 2 by a factor of 4, while slowing down path 1 by a factor of 1 since point C is charged at a speed four times faster than at point E. This is because gate 56 in path 1 has four times the current drive capability to drive capacitor 72 as compared to gate 62 in path 2 due to their relative physical sizes, i.e., there are four times current flowing at point C than at point E. By charging the capacitor 72 faster, it causes signals to move faster. Capacitor 72 also speeds up the logic transition at point C because point C is dynamically coupled to point E. Capacitor 74 functions in a similar manner as capacitor 72. The larger value of capacitor 74 is necessary for the larger sizes of inverters 58 and 66, which have larger current driving capabilities.

Figure 5:
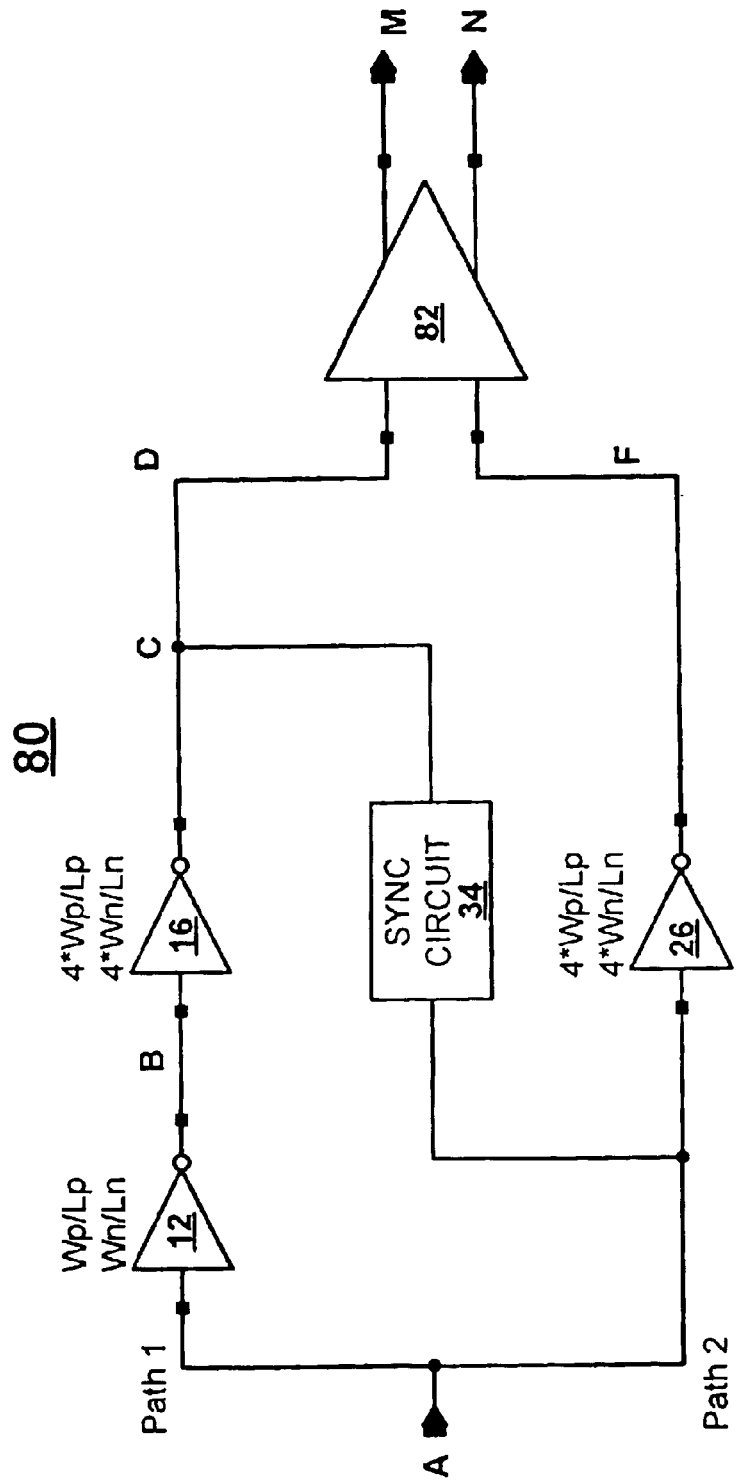
FIG. 5 shows a differential output structure according to a third embodiment of the invention.

FIG. 5 shows a differential output structure 80 according to a third embodiment of the invention. Output structure 80 is a variation of structure 30 shown in FIG. 2. It differs from structure 30 in that it does not include inverters 18 and 28 and sync circuit 36. Structure 80 operates in a similar manner as structure 30 in FIG. 2. In this embodiment, structure 80 includes a driver 82, which requires a smaller current to operate than that in FIG. 2.

Figure 6:
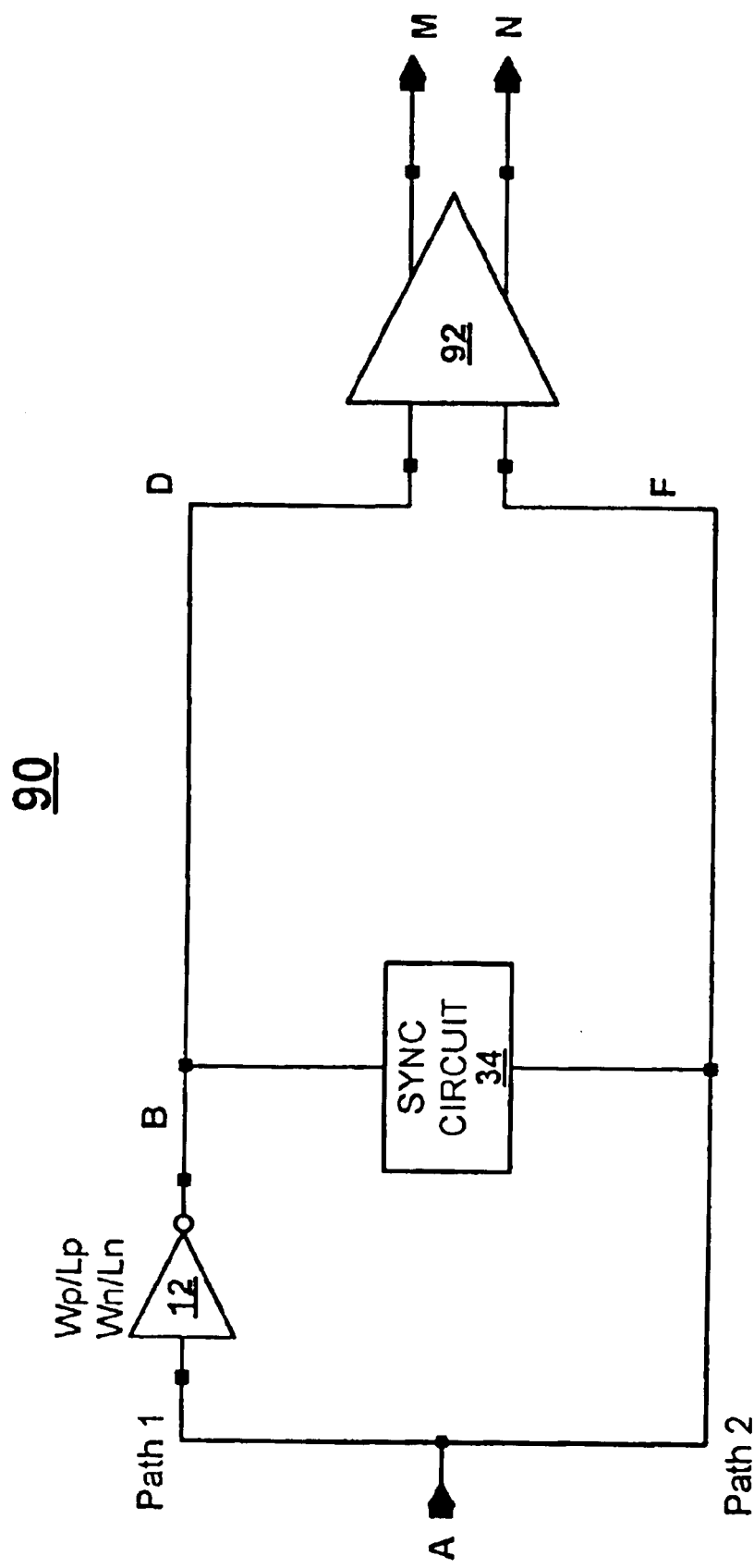
FIG. 6 shows a differential output structure according to a fourth embodiment of the invention.

FIG. 6 shows a differential output structure 90 according to a fourth embodiment of the invention. Output structure 90 is a variation of structure 80 shown in FIG. 5. It differs from structure 80 in that it does not include inverters 16 and 26.

Structure 90 operates in a similar manner as structure 80 in FIG. 5. In this embodiment, structure 90 includes a driver 92, which requires an even smaller current to operate than that in FIG. 5.

Figure 7:
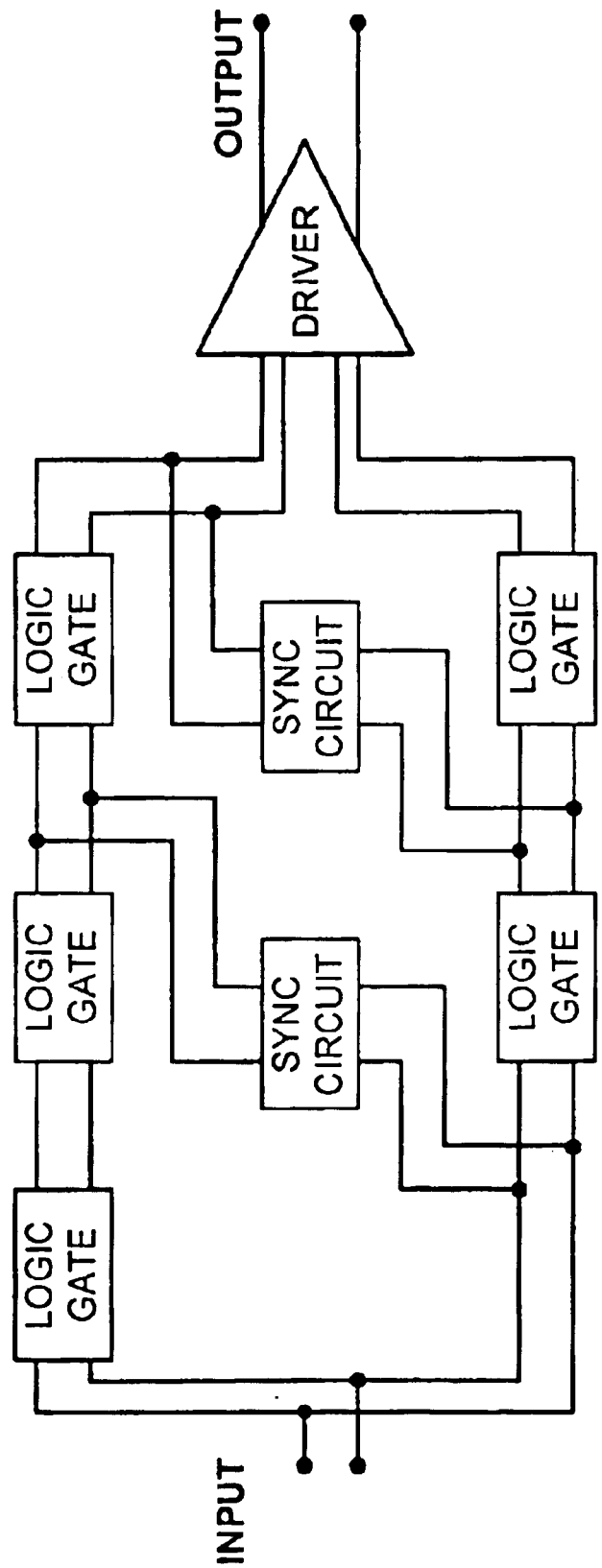
FIG. 7 illustrates an alternative embodiment of the invention which includes more than two paths.

It should be noted that there can be more than two paths as long as the gate elements, e.g., inverters, are differential, such as illustrated in FIG. 7.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. A differential output structure, comprising:
   an input line including:
   a first path having an input end for receiving an input signal, the first path also having an output end and including at least one driving element, and
   a second path having an input end and operably coupled to the input end of the first path for receiving the input signal, the second path also having an output end;
   an output driver, operably coupled to the output ends of the first and second paths, that is configured to provide differential outputs; and
   a bi-directional sync circuit, operably coupled between the first and second paths, which is configured to synchronize the speed of signals traveling on the two paths to arrive at the output driver by dynamically synchronizing the two paths bi-directionally through the sync circuit; the bi-directional sync circuit having a single connection to the first path and a single connection to the second path and being sized in accordance with relative connection positions in the first and second paths.

2. The structure of claim 1,
   wherein the first path further includes a plurality of driving elements connected in series to one another, the first path providing an inverted output of the input signal and
   wherein the second path includes a plurality of driving elements connected in series to one another, the second path providing a non-inverted output of the input signal.

3. The structure of claim 2, wherein the driving elements of the first and second paths have a predetermined constant taper ratio.

4. The structure of claim 2, wherein each sync circuit is coupled between an output of a driving element on the first path having a first current driving capability and an output of a driving element on the second path having a second current driving capability, and—wherein the first current driving capability is greater than the second current driving capability.

5. The structure of claim 1, further includes at least another sync circuit, operably coupled between the first and second paths, that is configured to synchronize the speed of signals traveling on the two paths.

6. The structure of claim 5, wherein each of the sync circuits includes a capacitances.

7. The structure of claim 1, wherein the sync circuit includes a capacitance.

8. The structure of claim 1, wherein the sync circuit is coupled between the output ends of the first and second paths.

9. The structure of claim 1, wherein the sync circuit dynamically synchronizes the two paths by slowing down a faster of the two paths such that the signals of the two paths arrive at the output driver at substantially a same time.

10. A differential output structure, comprising:
    an input line including:
    a first path having an input end for receiving an input signal, the first path also having an output end and including at least one driving element, and
    a second path having an input end and operably coupled to the input end of the first path for receiving the input signal, the second path also having an output end and including at least one driving element;
    an output driver, operably coupled to the output ends of the first and second paths, that is configured to provide differential outputs; and
    a plurality of bi-directional sync circuits, operably coupled between the first and second paths, which are configured to synchronize the speed of signals traveling on the two paths to arrive at the output driver by bidirectionally synchronizing the two paths through the sync circuits;
    the bi-directional sync circuits each having a single connection to the first path and a single connection to the second path, the sync circuits being sized relative to their position along each of the first and second paths and the connections being disposed between respective driving elements.

11. The structure of claim 10,
    wherein the first path further includes a plurality of driving elements connected in series to one another, the first path providing an inverted output of the input signal and
    wherein the second path includes a plurality of driving elements connected in series to one another, the second path providing a non-inverted output of the input signal.

12. The structure of claim 11, wherein the driving elements of the first and second paths have a predetermined constant taper ratio.

13. The structure of claim 11, wherein each sync circuit is coupled between an output of a driving element on the first path having a first current driving capability and an output of a driving element on the second path having a second current driving capability, and wherein the first current driving capability is greater than the second current driving capability.

14. The structure of claim 10, further includes at least another sync circuit, operably coupled between the first and second paths, that is configured to synchronize the speed of signals traveling on the two paths.

15. The structure of claim 14, wherein each of the sync circuits includes a capacitance.

16. The structure of claim 10, wherein the sync circuit includes a capacitance.

17. The structure of claim 10, wherein the sync circuit is coupled between the output ends of the first and second paths.

18. The structure of claim 10, wherein the sync circuit bidirectionally synchronizes the two paths by slowing down a faster of the two paths such that the signals of the two paths arrive at the output driver at substantially a same time.

19. A differential output structure, comprising:
    an input line including:
    a first path having an input and including at least one driving element, and a second path operably coupled to the first path at the input end for receiving an input signal;

an output driver, operably coupled to output ends of the first and second paths; and a bi-directional sync circuit, operably coupled between the first and second paths, which is configured to synchronize the speed of signals traveling on the two paths to arrive at the output driver by bidirectionally synchronizing the two paths through the synch circuit to slow a faster of the two paths, the bi-directional sync circuit having a single connection to the first path and a single connection to the second path and being sized in accordance with relative connection positions in the first and second paths.

20. The structure of claim 19, wherein the faster the two paths is slowed such that the signals of the two paths arrive at the output driver at substantially a same time.

* * * * *